(12) United States Patent
Koehler et al.

(10) Patent No.: US 11,488,006 B2
(45) Date of Patent: Nov. 1, 2022

(54) DISCRETIZATION OF NUMERICAL VALUES WITH ADAPTIVE ACCURACY

(71) Applicant: Robert Bosch GmbH, Stuttgart (DE)

(72) Inventors: Jan Mathias Koehler, Stuttgart (DE); Rolf Michael Koehler, Dettenhausen (DE)

(73) Assignee: Robert Bosch GmbH, Stuttgart (DE)

( * ) Notice: Subject to any disclaimer, the term of this patent is extended or adjusted under 35 U.S.C. 154(b) by 453 days.

(21) Appl. No.: 16/689,377

(22) Filed: Nov. 20, 2019

(65) Prior Publication Data

US 2020/0175356 A1 Jun. 4, 2020

(30) Foreign Application Priority Data

Nov. 30, 2018 (DE) .......................... 102018220701.1

(51) Int. Cl.
*G06N 3/00* (2006.01)
*G06N 3/063* (2006.01)
(Continued)

(52) U.S. Cl.
CPC ......... *G06N 3/063* (2013.01); *G06F 9/30145* (2013.01); *G06N 3/08* (2013.01);
(Continued)

(58) Field of Classification Search
CPC .......... G06N 3/063; G06N 20/00; G06N 3/08; G06N 3/04; G06F 9/30145; H03M 7/3059; H03M 7/6005; H03M 7/6011
See application file for complete search history.

(56) References Cited

U.S. PATENT DOCUMENTS 10,373,022 B1 * 8/2019 Zhang .................. G06N 3/0445

FOREIGN PATENT DOCUMENTS

WO 2018158043 A1 9/2018

OTHER PUBLICATIONS

Achterhold, et al.: "Variational Network Quantization", International Conference on Learning Representations 2018, pp. 1-18 https://openreview.neUforum?id=ry-TW-WAb [accessed on Jan. 22, 2021 ].

(Continued)

*Primary Examiner* — Joseph J Lauture
(74) *Attorney, Agent, or Firm* — Norton Rose Fulbright US LLP; Gerard Messina

(57) ABSTRACT

An encoder, connectable to a data-memory, for storing numerical values in the data-memory, which lie in a value range between a predefined-minimum-value and a predefined-maximum-value, the encoder including an assignment instruction, according to which the value range is subdivided into multiple discrete intervals, and the encoder being configured to classify a numerical value to be stored in exactly one interval and to output an identifier of this interval, the intervals varying in width on the scale of the numerical values. A decoder for numerical values, which are stored in a data-memory using an encoder, to assign according to one assignment instruction an identifier of a discrete interval retrieved from the data-memory a fixed numerical value belonging to this interval and to output it. Also described are an AI module including an ANN, an encoder and a decoder, and a method for manufacturing the AI module, and an associated computer program.

16 Claims, 3 Drawing Sheets

(51) Int. Cl.
  *G06N 3/08* (2006.01)
  *G06N 20/00* (2019.01)
  *H03M 7/30* (2006.01)
  *G06F 9/30* (2018.01)
  *G06N 3/04* (2006.01)

(52) U.S. Cl.
  CPC .......... *G06N 20/00* (2019.01); *H03M 7/3059* (2013.01); *H03M 7/6005* (2013.01); *H03M 7/6011* (2013.01); *G06N 3/00* (2013.01); *G06N 3/04* (2013.01)

(56) References Cited

OTHER PUBLICATIONS

Jung, et al.: "Learning to Quantize Deep Networks by Optimizing Quantization Intervals with Task Loss", arXiv preprint, (2018), pp. 1-10, https://arxiv.org/abs/1808.05779 [accessed on Jan. 22, 2021].
Zhang, et al.: "LQ-Nets: Learned Quantization for Highly Accurate and Compact Deep Neural Networks", arXiv preprint, (2018), pp. 1-18, https://arxiv.org/abs/1807.10029 [accessed on Jan. 22, 2021].

* cited by examiner

DISCRETIZATION OF NUMERICAL VALUES WITH ADAPTIVE ACCURACY

RELATED APPLICATION INFORMATION

The present application claims priority to and the benefit of German patent application no. DE 10 2018 220 701.1, which was filed in Germany on Nov. 30, 2018, the disclosure of which is incorporated herein by reference.

FIELD OF THE INVENTION

The present invention relates to the discretization of numerical values for storing in a data memory, the accuracy capable of being tailored to the respective application.

BACKGROUND INFORMATION

An artificial neural network, ANN, generally includes a plurality of layers having neurons, each of which combines a plurality of inputs with weights to form an activation. The activations formed in a layer, or a result ascertained from the activations by a further processing are each fed to the next adjacent layer until the ANN is completely passed through. The weights, the activations and the results ascertained therefrom are generally floating point numbers ("floats").

In order to reduce the memory required for the implementation of the ANN and, at the same time, to be able to use more affordable hardware with less energy consumption, hardware is frequently used which is specialized for calculations with fixed-point numbers ("fixed-points") or with whole numbers ("integers"). The floating point numbers are then discretized to form fixed-point numbers or integers.

Patent document WO 2018/158 043 A1 discusses a method for coding numerical values in an ANN, in which the highest value bit is reserved specifically for the coding of the value zero. In this way, it may be particularly quickly checked whether the value is zero.

SUMMARY OF THE INVENTION

An encoder has been developed in conjunction with the present invention in a data memory for storing numerical values, which lie in a value range between a predefined minimum value and a predefined maximum value. For this purpose, the encoder is connectable to a data memory.

The encoder contains an assignment instruction, according to which the value range is subdivided into multiple discrete intervals. An interval in this case is understood to mean, in particular, a set of numbers made up of elements that lie between a predefined upper limit and a predefined lower limit. Thus, the subdivision into discrete intervals entails specifying an upper limit and a lower limit for each interval.

The encoder is configured to categorize a numerical value to be stored in exactly one interval and to output an identifier of this interval, this output capable of being provided, in particular, to the data memory. The storage of the numerical value is then embodied in the identifier stored in the memory. This means that each numerical value in the data memory occupies only as much memory capacity as the identifier. Thus, if the numerical values are discretized into 256 different intervals, for example, then 8 bits are needed in order to store a distinct identifier for each of the intervals. The intervals vary in width on the scale of the numerical values.

In the process, floating point numbers, in particular, may be discretized to form fixed-point numbers or even integers. However, this is not absolutely necessary. The required memory may also be reduced if whole numbers (for example, 64 bit long "long integer") are discretized into a number of intervals, the identifiers of which occupy less memory capacity (for example, 22 bits for the representation of 65,536 intervals).

The discretization to form intervals is a lossy compression of the numerical values. This means, it is always accompanied by a loss of accuracy. It has been found that the effects of this loss of accuracy resulting from the intervals of different widths on the application in which the numerical values are used may be significantly reduced. This is based on the finding that in many applications not all numerical values are of equal importance. Thus, for example, higher weights and activation values have a significantly greater influence on the ultimately delivered output than lower values during processing in artificial neural networks, ANNs. It is therefore meaningful to depict the higher values with a better accuracy than the lower values. The exact difference between higher values is, in particular, more relevant than the differences between low values. This is precisely what may be reflected by the encoder.

In one particularly advantageous embodiment, the width of the discrete intervals on the scale of the numerical values may drop monotonously as the average absolute value of the numerical values contained in the intervals in each case increases. With one and the same number of bits needed in the data memory for the identifier of an interval, it is then possible in terms of amount to store lower numerical values having a lower accuracy and, in terms of amount, higher numerical values having a better accuracy.

For example, the width of the discrete intervals on the scale of the numerical values may vary exponentially with a continuous index k over intervals and/or over groups of intervals. Such an assignment instruction accurately reflects the correlation between the amount and importance of the numerical values for many applications.

For example, an integral value range between 0 and $2^R$ is predefined with a positive whole number R, which is to be discretized into $2^P$ (with P<R) different groups of intervals. In this case, all intervals belonging to one group of intervals are equally wide, but the intervals belonging to different groups vary in width. Then, for example, lower limit $U_k$ of the numerical values for each group k at which this group k begins may be specified as $$U_k = 2^R - k \cdot 2^{R-P} \qquad (1)$$

and upper limit $O_k$, at which this group ends, as $$O_k = 2^R - (k-1) \cdot 2^{R-P} \qquad (2),$$

this upper limit $O_k$ already no longer being intended to belong to group k. The number $N_k$ of the intervals belonging to group k may then be specified as $$N_k = 2^{R-P-k+1} \qquad (3).$$

Thus, $N_k$ is equivalent to the number of different interval identifiers needed in order to represent all intervals from group k. Thus, in order to reflect the entire original value range of 0 to $2^R$, $$N = \sum_{k=1}^{2^P} N_k$$

different interval identifiers are needed.

This is illustrated in a number example with R=10 and P=3. Since $2^{R-P}=2^7=128$, each of the $2^3=8$ groups extends over 128 numerical values of the original value range.

For the first group with k=1, the formula for $N_k$ states that the range between lower limit $U_1=896$ and $O_1=1024$, with the exception of 1024, is to be divided into $N_1=128$ intervals. Thus, the 128 highest discrete numerical values of the entire value range are mapped to interval identifiers without loss of accuracy.

For the second group with k=2, the formula for $N_k$ states that this group is to contain only $N_2=64$ intervals. Thus, the 128 numerical values in this group (between $U_2=768$ and $O_2=896$, with the exception of 896) are compressed to 64 interval identifiers and, therefore by a factor of 2.

This continues until k=8. For k=8, the entire range of $U_8=0$ to $O_8=128$, with the exception of 128, is compressed into only $N_8=2_0=1$ single interval, i.e., by a factor of 128.

Overall, N=255 (128+64+32+22+8+4+2+1) different identifiers are needed for intervals, which may be represented with a memory requirement of 8 bits. In contrast, 10 bits were originally needed in order to store all 1024 discrete numerical values of the original value range. Thus, a total of 20% of memory capacity is saved.

The stored numerical values, in particular, in an ANN are in many cases intermediate results, with which further calculations are to be made later once again. For this purpose, it is necessary by using a decoder to translate the identifier of the interval stored in the data memory back into a numerical value, with which further calculations may be made. Hence, the present invention also relates to a decoder for numerical values, which are stored in a data memory using the described encoder. This decoder is configured to assign according to one assignment instruction an identifier of a discrete interval retrieved from the data memory a fixed numerical value belonging to this interval and to output it.

The decoder in this case may, for example, be configured to assign at least one identifier of a discrete interval the maximum, the minimum or the average value of the numerical values belonging to this interval. These variables are at least approximations for the originally stored numerical value, whose maximum error is known in advance.

In order to significantly reduce the average error during the reconstruction, the encoder in another particularly advantageous embodiment is also configured to record, for at least one of the discrete intervals, a summarized statistic regarding input numerical values that the encoder assigned to the discrete interval. Based on this summarized statistic, it is possible to derive a better motivated numerical value, which the decoder may assign to the identifier of the interval during the subsequent reconstruction.

For this purpose, the encoder may be configured, in particular, to ascertain within the scope of the summarized statistic a percentile (for example, the $75^{th}$ percentile), an average value and/or a median of the numerical values that is assigned to the discrete interval by the encoder.

The storing of the summarized statistic in addition to the identifiers of the intervals takes up a minimal amount of additional memory capacity.

According to the preceding description, the discretization of numerical values into intervals of different widths is particularly advantageous for the implementation of artificial neural networks, ANN, since in this case, higher numerical values, in particular, have a greater influence on the ultimately targeted output in terms of absolute value than do lower numerical values in terms of absolute value. Hence, the present invention also relates to an artificial intelligence module, AI module, having an ANN that includes a plurality of layers with neurons. The neurons are each configured to combine a plurality of inputs with weights to form an activation. These activations may be selectively used directly as inputs for the next layer of the ANN or else may be processed via an optional non-linear processing stage to form a result, which in turn is then fed as input to the next layer.

Such a non-linear processing stage may, for example, include a rectifying function, which outputs only the positive portion of its argument and otherwise outputs zero (rectified linear unit, ReLU).

At least one encoder for storing the weights of at least one layer and/or at least the activations formed in one layer and/or results is/are provided in a data memory. At least one decoder is also provided for retrieving the weights, activations or results from the data memory.

As previously described, the discretization using the encoder has the effect of significantly reducing the memory required in the data memory. At the same time, this discretization prepares the groundwork for an implementation of the ANN in hardware, which is configured specifically for fixed-point calculations or integer calculations. Hence, the neurons in one particularly advantageous embodiment are implemented in the AI module with a processing unit, which is configured for fixed-point calculations or integer calculations.

The orders of magnitude in which the numerical values of activations, weights and results move may differ from layer to layer of the ANN. Thus, for example, non-linear processing stages, each of which processes the output of a neuron to form a result, ensure that the amounts of the activations successively increase from layer to layer. If, for example, the "rectified linear unit" (ReLU) is used as a non-linear processing stage, the activations in the first layer of the ANN may, for example, be between 0 and 2, whereas they are already between 0 and 40 in the fifth layer. Hence, in one advantageous embodiment, encoders having different assignment instructions of numerical values to intervals are provided for different layers of the ANN.

In another advantageous embodiment, decoders having different assignment instructions of interval identifiers to numerical values are also provided for different layers of the ANN. The encoders may, for example, divide different value ranges into intervals in different ways for different layers of the ANN, and the decoder should then correspond to these in each case. The encoders may also, for example, create different summarized statistics for different layers of the ANN with respect to one and the same discrete interval, so that the decoders of the identifier of this interval are able in each case to assign a suitable numerical value for the further calculations.

The encoder and the decoder may be situated at an arbitrary location in the AI module. The encoder and the decoder may, for example, be connected in a path for the direct memory access (DMA) or also, for example, may be located at an arbitrary position at which it exclusively controls the access to at least a portion of the data memory. However, the encoder and the decoder may, for example, also be implemented within the software implementation of the ANN and may employ the conventional methods for the memory access provided by the hardware and by the operating system.

An ANN is typically initialized using random values or other start values for the weights occurring therein, and the final weights then form only during the training. The training thus decides the orders of magnitude in which the numerical values of activations, weights and results move.

Hence, the present invention also relates to a method for manufacturing the described AI module.

In conjunction with this method, the weights of the ANN in the AI module are initially trained with the aid of learning datasets for the input data and for the associated learning outputs. In the process, the weights are optimized, in particular, in such a way that the ANN supplies in each case an output to the learning datasets, which corresponds sufficiently closely to the associated learning output on the basis of an error function.

It is then ascertained for the input data based on datasets, in which value range the activations and/or results formed in at least one layer of the ANN lie. The value range ascertained in this manner, and/or a value range in which the weights ascertained during the training lie, is/are established as the value range for at least one encoder of the AI module. These datasets may, for example, contain learning datasets used for the training, test datasets used for the validation after the training or also for arbitrary combinations thereof.

As previously described, this specification may take place separately for each individual layer of the ANN. A global value range for all activations, results or weightings of the entire ANN may, however, also be specified, which covers all numerical values occurring in the ANN.

Situations in which the exact difference between higher numerical values is more important than differences between lower numerical values may occur, in particular, if an ANN is used for classification tasks. In this type of tasks, high confidences for multiple classes may be close to one another, and only these classes are even considered for the selection of the ultimately output class. Hence, the exact distinction between these classes is much more important than a distinction between classes, with respect to which the confidence has already been classified significantly lower. Hence, the AI module described is particularly advantageously used for speech recognition, object detection, line estimation, ego line estimation, fraud detection, facial recognition and/or semantic segmentation based on physically received measured data. Important applications here are, for example, driver assistance systems, the control of an at least semi-automated vehicle in road traffic as well as access control, in which it is essential to detect the presence of a valid access medium.

The encoder and the decoder may be wholly or partially implemented in a software, which may, in particular, also be subsequently retrofitted on an existing AI module. This software is therefore a separate product with the direct customer benefit that the performance of an AI module equipped with the software is improved. Hence, the present invention also relates to a computer program having machine-readable instructions which, when they are executed on a computer and/or on an embedded system, upgrade the computer and/or the embedded system to the described encoder and/or to the described decoder, and/or prompt the computer or the embedded system to carry out the described method for manufacturing an AI module. The present invention also relates to a machine-readable data carrier or to a download product having a computer program.

Additional measures improving the present invention are described in greater detail below together with the description of the exemplary embodiments of the present invention with reference to figures.

DETAILED DESCRIPTION

Figure 1:
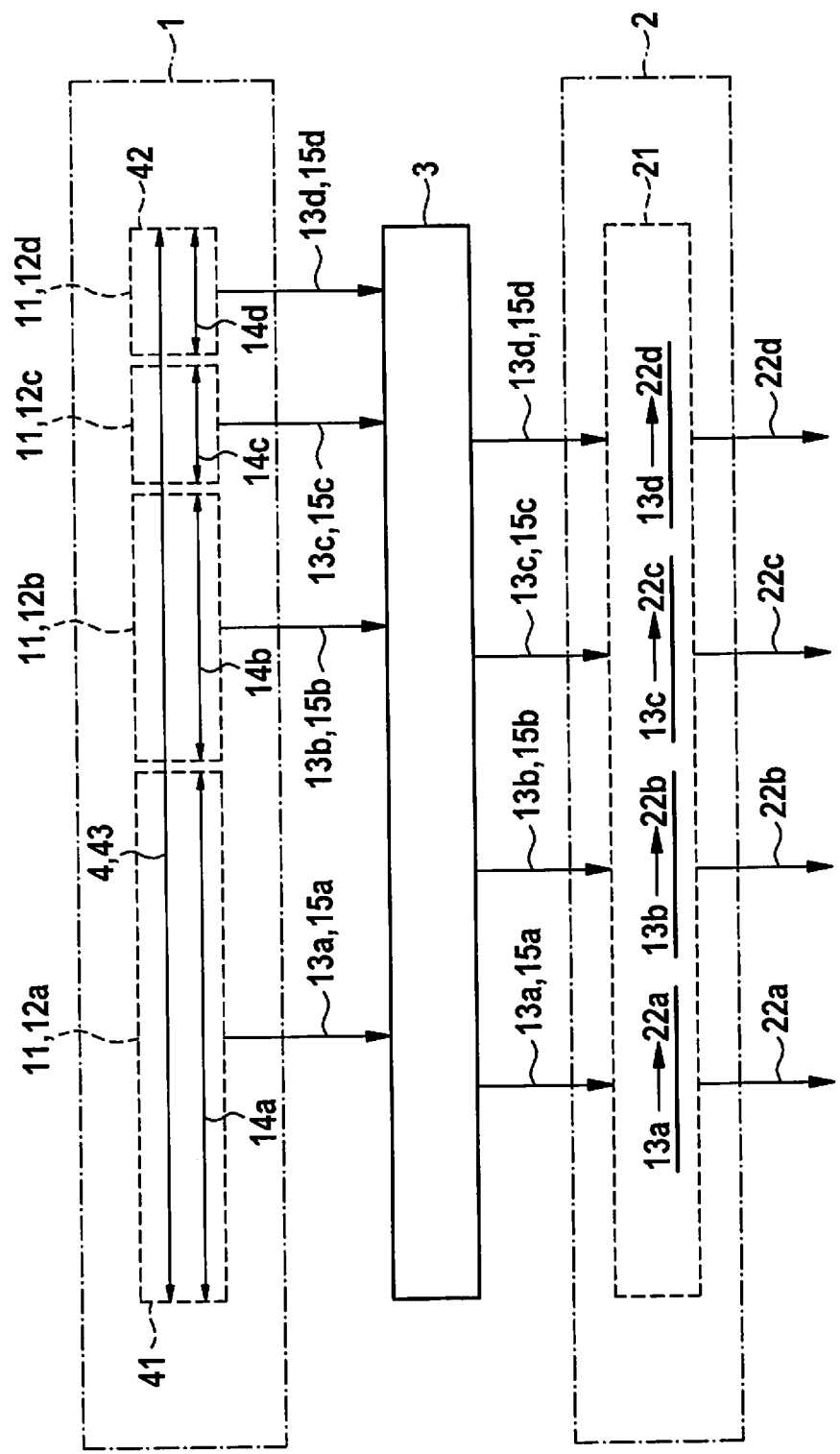
FIG. 1 shows a coding of numerical values 4 using an exemplary encoder 1 and decoding using an exemplary decoder 2.

According to FIG. 1, numerical values 4, which extend over a value range 43 between a predefined minimum value 41 and a predefined maximum value 42, accrue from an arbitrary source. These numerical values are to be stored in a discretized, space-saving form in data memory 3.

Exemplary encoder 1 is used for this purpose. According to assignment instruction 11 in encoder 1, value range 43 is subdivided into discrete intervals 12a through 12d, the widths 14a through 14d of which are different. Identifier 13a through 13d of respective intervals 12a through 12d is stored in data memory 3 depending upon in which of intervals 12a through 12d a specific numerical value 4 to be stored falls.

Encoder 1 also records summarized statistics 15a through 15d regarding the numerical values 4 that it has assigned to each of individual intervals 12a through 12d. These summarized statistics 15a through 15d are also output into data memory 3. Since these statistics 15a through 15d are a comprimate of a large number of individual values 4, the additional space requirement in data memory 3 is very low.

If a numerical value 4 is needed again in order to make further calculations with it, identifier 13a through 13d of interval 12a through 12d stored in data memory 3, as well as potentially present summarized statistics 15a through 15d, are retrieved from data memory 3 instead of this numerical value 4. Assignment instruction 21 of decoder 2 assigns identifier 13a through 13d a fixed value 22a through 22d, which supplants originally input numerical value 4 for further use. In the process, the summarized statistic recorded by encoder 1 for each interval 12a through 13d and stored in data memory 3 may, in particular, also be referred to for specifying fixed value 22a through 22d belonging to each identifier 13a through 13d.

Figure 2:
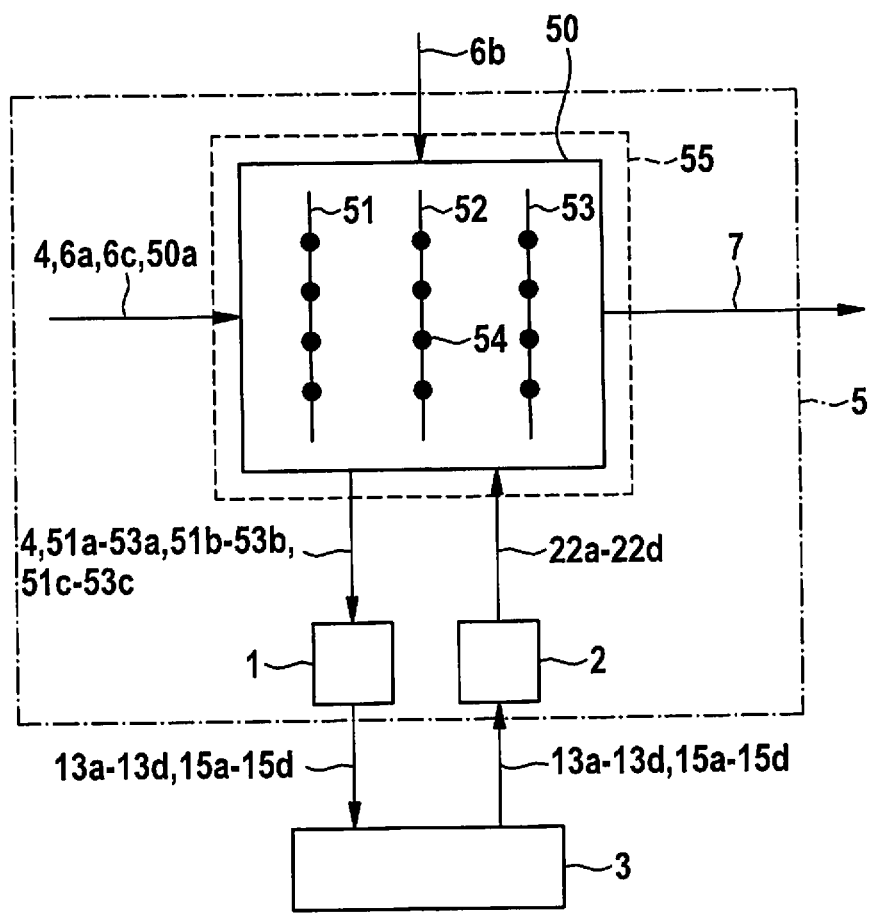
FIG. 2 shows an exemplary embodiment of an AI module including encoder 1 and decoder 2.

FIG. 2 shows an exemplary embodiment of AI module 5. AI module 5 includes an artificial neural network, ANN 50. ANN 50 is made up of a multitude of layers, three of which are depicted by way of example in FIG. 2 and identified with reference numerals 51 through 53. Each layer 51 through 53 includes a multitude of neurons, one of which is identified with reference numeral 54 in FIG. 2. AI module 5 is intended to transform numerical values 4, for example, measured data based on physical observations, into an output 7 correct for the respective application, for example, a classification of these measured data.

To train ANN 50, ANN 50 is provided with learning datasets 6a and internal weights 51a through 53a are optimized in layers 51 through 63 in such a way that output 7 of ANN 5 corresponds sufficiently closely to associated learning output 6b on the basis of an error function. To configure encoder 1, which is explained in greater detail in conjunction with FIG. 3, datasets are continued to be input into ANN 50. These datasets may, for example, include learning datasets used for the training, test datasets used for the validation after the training, or also arbitrary combinations thereof.

Neurons 54 of ANN 50 in this case are implemented at least in the fully trained state with a processing unit 55, which is configured for fixed-point calculations or integer calculations. Hardware may be used for the training, which operates with floating point numbers, so that the small gradient steps occurring during the training are not suppressed by rounding effects.

Activities 51b through 53b resulting in layers 51 through 53 of ANN 50, as well as results 51c through 53c ascertained therefrom by non-linear processing are stored in data memory 3 via encoder 1. Weights 51a through 53a resulting after the training are also stored in this manner. As described in conjunction with FIG. 1, identifier 13a through 13d of an interval 12a through 12d, into which the numerical value falls, is stored for each relevant numerical value 4. Summarized statistics 15a through 15d regarding all numerical values 4 assigned respectively to interval 12a through 12d are also stored.

If numerical values 4 are needed again, for example, in order to create the input for next layer 51 through 53, identifiers 13a through 13d are assigned fixed values 22a through 22d using decoder 2 from respective intervals 12a through 12d, as described in conjunction with FIG. 1. During the further processing, these fixed values 22a through 22d supplant numerical values 4, which were originally submitted for storing. They may be specified, for example, by referring to respective summarized statistics 15a through 15d.

Figure 3:
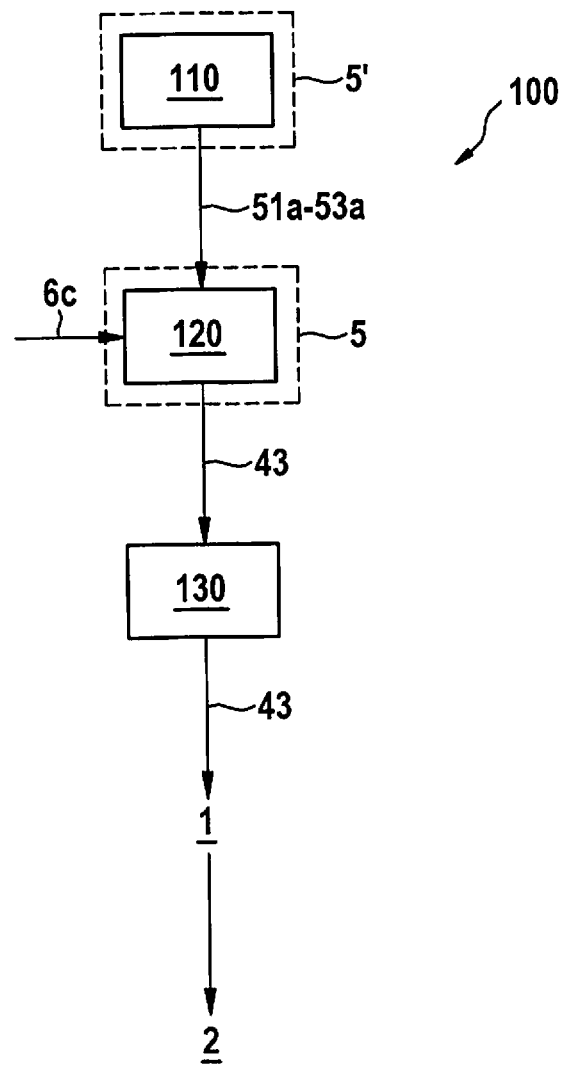
FIG. 3 shows an exemplary embodiment of method 100.

FIG. 3 shows one exemplary embodiment of method 100. In step 110, AI module 5 is initially present still in its untrained state 5' and is trained, as previously described. This results in internal weights 51a through 53a of layers 51 through 53 in ANN 50 of AI module 5. AI module 5 is now present in its trained state.

In this trained state, AI module 5 is fed data sets 6c for input data in step 120. These datasets 6c may include learning datasets 6a used for the training, test datasets used for the validation after the training or also for arbitrary combinations thereof. Datasets 6c may however also be disjunct to learning datasets 6a and/or to the test datasets. It is tested in which value ranges 43 activations 51b through 53b formed in layers 51 through 53 of ANN 50 or results 51c through 53c ascertained therefrom lie.

These value ranges are specified in step 130 as value ranges 43 for at least one encoder 1 of AI module 5. Value range 43, in which weights 51a through 53a ascertained during training 110, is also specified as value range 43 for at least one such encoder 1.

These adaptations of encoder 1 may, in particular, also be tracked by respectively associated decoder 2.

What is claimed is:

1. An encoding device, comprising:
an encoder, wherein the encoder:
is connectable to a data memory;
is configured for storing in the data memory a plurality of numerical values that lie in a value range between a predefined minimum value and a predefined maximum value;
includes an assignment instruction according to which the value range is subdivided into multiple discrete intervals whose widths vary on a scale of the numerical values; and
with respect to each of respective numerical values of the plurality of numerical values, is configured to:
classify the respective numerical value to be stored in exactly one of the intervals; and
output an identifier of the one of the intervals of the respective numerical value.

2. The encoding device of claim 1, wherein the widths of the discrete intervals on the scale of the numerical values drops monotonously as a respective average absolute value of the respective ones of the numerical values contained in each of the intervals increases.

3. The encoding device of claim 1, wherein the widths of the discrete intervals on the scale of the numerical values varies exponentially with a continuous index k across the intervals and/or across groups of the intervals.

4. The encoding device of claim 1, wherein, for each of at least one of the discrete intervals, the encoder is configured to maintain a statistical summary regarding the respective numerical values that have been assigned by the encoder to the respective discrete interval.

5. The encoding device of claim 4, wherein, for the each of the at least one of the discrete intervals, the encoder is configured to ascertain, in conjunction with the statistical summary of the respective discrete interval, a percentile, an average value, and/or a median of the numerical values that have been assigned by the encoder to the respective discrete interval.

6. A decoding device for numerical values that have been stored in a data memory using an encoder, wherein the encoder (a) is connectable to the data memory, (b) is configured for storing in the data memory a plurality of numerical values that lie in a value range between a predefined minimum value and a predefined maximum value, (c) includes an assignment instruction according to which the value range is subdivided into multiple discrete intervals whose widths vary on a scale of the numerical values and which are each assigned a respective identifier, and (d) with respect to each of the respective numerical values of the plurality of numerical values, is configured to (I) classify the respective numerical value to be stored in exactly one of the intervals and (II) output the identifier of the one of the intervals of the respective numerical value, the decoding device comprising:
a decoder, wherein the decoder is configured to:
assign, according to an assignment instruction, the identifier of a respective one of the discrete intervals, which is retrieved from the data memory, to a fixed numerical value belonging to the respective one of the discrete intervals; and
output the fixed numerical value.

7. The decoding device of claim 6, wherein the decoder is configured to assign the retrieved identifier a maximum, a minimum, or an average value of those of the numerical values that belong to the respective one of the discrete intervals.

8. The decoding device of claim 6, wherein the decoder is configured to assign the retrieved identifier a numerical value ascertained with a statistical summary provided, and assigned to the respective one of the discrete intervals, by the encoder, and wherein the statistical summary is regarding the respective ones of the numerical values of the respective one of the discrete intervals.

9. An artificial intelligence (AI) module, comprising:
an artificial neural network (ANN), including:
a plurality of layers having neurons, each combining a plurality of inputs having weights to form an activation;
a non-linear processing stage for further processing the activation to form a result optionally;
at least one encoder for storing the weights of at least one of the layers and/or at least the activations formed in the at least one of the layers and/or results, in a data memory; and
at least one decoder for retrieving the weights, activations, or results from the data memory.

10. The AI module of claim 9, wherein the at least one encoder has different assignment instructions of numerical values to intervals for different ones of the layers of the ANN.

11. The AI module of claim 9, further comprising:
decoders having different assignment instructions of interval identifiers to numerical values for different ones of the layers of the ANN.

12. The AI module of claim 9, wherein the neurons are implemented by a processing unit that is configured for performing fixed-point calculations or integer calculations.

13. A method for manufacturing an AI module having an artificial neural network (ANN), the method comprising:
training, by a computer processor executing an error function, weights of the ANN for input data and associated learning outputs with learning datasets of values for the input data so that, for each respective one of learning datasets, the ANN supplies to the respective learning dataset an output that corresponds with at least a predefined approximation the associated learning output of the respective learning dataset, the training being performed based on an error function;
ascertaining, by the computer processor and for the values for the input data of the datasets, in which value range activations and/or results formed in at least one layer of the ANN lie; and
specifying, by the computer processor, a value and/or a value range in which the weights ascertained by the training lie, as a value range for at least one encoder of the AI module.

14. The AI module of claim 9, wherein the AI module is used for at least one of: speech recognition, object detection, line estimation, ego line estimation, fraud detection, facial recognition and/or semantic segmentation based on physically received measured data.

15. A non-transitory computer readable medium having program code that is executable by a computer and/or an embedded system for upgrading the computer and/or the embedded system to operate as an encoder and/or a decoder, wherein:
the encoder:
is connectable to data memory,
is configured for storing in the data memory a plurality of numerical values that lie in a value range between a predefined minimum value and a predefined maximum value;
includes an assignment instruction according to which the value range is subdivided into multiple discrete intervals whose widths vary on a scale of the numerical values; and
with respect to each of respective numerical values of the plurality of numerical values, is configured to:
classify the respective numerical value to be stored in exactly one of the intervals; and
output an identifier of the one of the intervals of the respective numerical value; and
the decoder is configured to:
assign, according to an assignment instruction, the identifier of a respective one of the discrete intervals, which is retrieved from the data memory, to a fixed numerical value belonging to the respective one of the discrete intervals; and
output the fixed numerical value.

16. A non-transitory computer readable medium having program code that is executable by a computer and/or an embedded system for manufacturing an AI module having an artificial neural network (ANN) by performing the following:
training weights of the ANN for input data and associated learning outputs with learning datasets of values for the input data so that, for each respective one of learning datasets, the ANN supplies to the respective learning dataset an output that corresponds with at least a predefined approximation the associated learning output of the respective learning dataset, the training being performed based on an error function;
ascertaining, for the values for the input data of the datasets, in which value range activations and/or results formed in at least one layer of the ANN lie; and
specifying a value and/or a value range in which the weights ascertained by the training lie, as a value range for at least one encoder of the AI module.

\* \* \* \* \*